United States Patent
Wilson et al.

(10) Patent No.: US 11,144,309 B2
(45) Date of Patent: Oct. 12, 2021

(54) CHANGESET CONFLICT REBASING

(71) Applicant: Bentley Systems, Incorporated, Exton, PA (US)

(72) Inventors: Samuel W. Wilson, Downingtown, PA (US); Keith A. Bentley, Elverson, PA (US)

(73) Assignee: Bentley Systems, Incorporated, Exton, PA (US)

(*) Notice: Subject to any disclaimer, the term of this patent is extended or adjusted under 35 U.S.C. 154(b) by 0 days.

(21) Appl. No.: 16/516,431

(22) Filed: Jul. 19, 2019

(65) Prior Publication Data
US 2020/0117445 A1    Apr. 16, 2020

Related U.S. Application Data

(60) Provisional application No. 62/745,104, filed on Oct. 12, 2018.

(51) Int. Cl.
*G06F 8/71* (2018.01)
*G06F 16/28* (2019.01)
*G06F 16/21* (2019.01)

(52) U.S. Cl.
CPC .............. *G06F 8/71* (2013.01); *G06F 16/211* (2019.01); *G06F 16/284* (2019.01)

(58) Field of Classification Search
CPC ......... G06F 8/71; G06F 16/284; G06F 16/211
See application file for complete search history.

(56) References Cited

U.S. PATENT DOCUMENTS

| | | |
|---|---|---|
| 6,341,291 B1 | 1/2002 | Bentley et al. |
| 9,390,201 B2 | 7/2016 | Rameau et al. |
| 9,430,229 B1 | 8/2016 | Van Zijst et al. |
| 9,575,764 B1 | 2/2017 | Turner et al. |
| 2007/0021955 A1* | 1/2007 | Tolone ............... G06F 30/20 703/22 |
| 2008/0140732 A1 | 6/2008 | Wilson et al. |
| 2014/0013099 A1* | 1/2014 | Sekiguchi ............. G06F 8/71 713/100 |
| 2015/0286558 A1* | 10/2015 | Bartlow ................ G06F 8/71 717/131 |
| 2016/0162363 A1* | 6/2016 | Letkeman ........ G06F 11/1464 707/641 |
| 2017/0220606 A1* | 8/2017 | Wang ............... G06F 16/212 |
| 2019/0004925 A1* | 1/2019 | Buckingham ..... G06Q 10/101 |

(Continued)

OTHER PUBLICATIONS

Brun, Yuriy, et al., "Early Detection of Collaboration Conflicts and Risks," IEEE Computer Society, IEEE Transactions on Software Engineering, vol. 39, No. 10, Oct. 2013, pp. 1358-1375.

(Continued)

*Primary Examiner* — Wei Y Zhen
*Assistant Examiner* — Amir Soltanzadeh
(74) *Attorney, Agent, or Firm* — Cesari and McKenna, LLP; James A. Blanchette

(57) ABSTRACT

In example embodiments, techniques are provided to implement changeset conflict rebasing when performing conflict-detection and merging in an infrastructure modeling software architecture that uses an optimistic concurrency policy. Changeset conflict rebasing involves adjusting the pre-change values in a local changeset so they match post-change values of a remote version, rather an original base version, or removing changes from the local changeset entirely.

15 Claims, 10 Drawing Sheets

(56) References Cited

U.S. PATENT DOCUMENTS

2019/0079958 A1 3/2019 Bentley et al.
2019/0081847 A1 3/2019 Bentley et al.
2019/0108245 A1 4/2019 Bentley et al.
2019/0354540 A1* 11/2019 Stigsen ................ G06F 16/275

OTHER PUBLICATIONS

"Notification of Transmittal of the International Search Report and the Written Opinion of the International Searching Authority, or the Declaration," International Filing Date: Oct. 1, 2019, International Application No. PCT/US2019/054051, Applicant: Bentley Systems, Incorporated, dated Jan. 22, 2020, pp. 1-16.
U.S. Appl. No. 16/559,057, filed Sep. 3, 2019 by Keith A. Bentley et al. for Techniques for Decoupling Access to Infrastructure Models, pp. 1-26.

* cited by examiner

FIG. 4

| LOCAL CHANGE | REMOTE CHANGE | HOW TO HANDLE REMOTE CHANGE | HOW TO REBASE LOCAL CHANGE |
|---|---|---|---|
| UPDATE | UPDATE | REJECT | CHANGE LOCAL PRE-CHANGE VALUE TO MATCH REMOTE CHANGE POST-CHANGE VALUE |
| UPDATE | UPDATE | ACCEPT | REMOVE LOCAL CHANGE FROM LOCAL CHANGESET |
| UPDATE | DELETE | REJECT | REJECT IS NOT SUPPORTED – MUST ACCEPT |
| UPDATE | DELETE | ACCEPT | REMOVE LOCAL CHANGE FROM LOCAL CHANGESET |
| DELETE | UPDATE | REJECT | CHANGE LOCAL PRE-CHANGE VALUE TO MATCH REMOTE CHANGE POST-CHANGE VALUE |
| DELETE | UPDATE | ACCEPT | ACCEPT IS NOT SUPPORTED – MUST REJECT |
| DELETE | DELETE | REJECT OR ACCEPT | REMOVE LOCAL CHANGE FROM LOCAL CHANGESET |

FIG. 5A

| ElementID | PropertyA |
|---|---|
| 1 | 0 |

FIG. 5B

[0] {insert: ElementID=1, PropertyA=0}      ← Tip

FIG. 5C

| ElementID | PropertyA |
|---|---|
| 1 | 1 |

FIG. 5D

[0] {insert: ElementID=1, PropertyA=0}   <- parent
[1.1] {update: ElementID=1, {Old: PropertyA= 0}, {New: PropertyA=1}}

FIG. 5E

| ElementID | PropertyA |
|---|---|
| 1 | 2 |

FIG. 5F

[0] {insert: ElementID=1, PropertyA=0}   <- parent
[2.1] {update: ElementID=1, {Old: PropertyA= 0}, {New: PropertyA=2}}

FIG. 5G

[0] {insert: ElementID=1, PropertyA=0}
[1] {update: ElementID=1, {Old: PropertyA= 0}, {New: PropertyA=1}} ☐ ← Tip

FIG. 5H

[1] {update: ElementID=1, {Old: PropertyA= 0}, {New: PropertyA=1}}

FIG. 5I

[0] {insert: ElementID=1, PropertyA=0}
[1] {update: ElementID=1, {Old: PropertyA= 0}, {New: PropertyA=1}} ← parent
[2.1] {update: ElementID=1, {Old: PropertyA= 0}, {New: PropertyA=2}}

FIG. 5J

[0] {insert: ElementID=1, PropertyA=0}
[1] {update: ElementID=1, {Old: PropertyA= 0}, {New: PropertyA=*1*}}
[2c] {update: ElementID=1, {Old: PropertyA= *0*}, {New: PropertyA=2}} ←Tip

FIG. 5K

[0] {insert: ElementID=1, PropertyA=0}
[1] {update: ElementID=1, {Old: PropertyA= 0}, {New: PropertyA=1}} ← parent
[2.1] {update: ElementID=1, {Old: PropertyA= 1}, {New: PropertyA=2}}

FIG. 5L

[0] {insert: ElementID=1, PropertyA=0}
[1] {update: ElementID=1, {Old: PropertyA= 0}, {New: PropertyA=1}}
[2] {update: ElementID=1, {Old: PropertyA= 1}, {New: PropertyA=2}} ← Tip

FIG. 6A

| ElementID | PropertyA |
|---|---|
| 1 | 1 |

FIG. 6B

[0] {insert: ElementID=1, PropertyA=0}
[2.1] {update: ElementID=1, {Old: PropertyA= 0}, {New: PropertyA=2}}
[1] {update: ElementID=1, {Old: PropertyA= 0}, {New: PropertyA=1}} ← parent

FIG. 6C

[0] {insert: ElementID=1, PropertyA=0}
[1] {update: ElementID=1, {Old: PropertyA= 0}, {New: PropertyA=1}} ← parent

FIG. 7A

| ElementID | PropertyA |
|---|---|
| 1 | 0 |

FIG. 7B

[0] {insert: ElementID=1, PropertyA=0}  ← Tip

FIG. 7C

[0] {insert: ElementID=1, PropertyA=0}  ← parent
[1.1] {update: ElementID=1, {Old: PropertyA= 0}, {New: PropertyA=1}}

FIG. 7D

[0] {insert: ElementID=1, PropertyA=0}  ← parent
[2.1] {delete: ElementID=1, {Old: PropertyA= 0}}

FIG. 7E

[0] {insert: ElementID=1, PropertyA=0}
[1] {update: ElementID=1, {Old: PropertyA= 0}, {New: PropertyA=1}} ← Tip

FIG. 7F

[0] {insert: ElementID=1, PropertyA=0}
[1] {update: ElementID=1, {Old: PropertyA= 0}, {New: PropertyA=*1*}} ← parent
[2.1] {delete: ElementID=1, {Old: PropertyA= *0*}}

FIG. 7G

[0] {insert: ElementID=1, PropertyA=0}
[1] {update: ElementID=1, {Old: PropertyA= 0}, {New: PropertyA=*1*}} ← parent
[2.1] {delete: ElementID=1, {Old: PropertyA= *1*}}

CHANGESET CONFLICT REBASING

RELATED APPLICATIONS

Priority is claimed to previously filed U.S. Provisional Patent Application No. 62/745,104, the contents of which are incorporated herein by reference in their entirety.

BACKGROUND

Technical Field

The present disclosure relates generally to infrastructure modeling, and more specifically to techniques used to address problems in conflict-detection and merging in an infrastructure modeling software architecture.

Background Information

Throughout the design, construction and operation of infrastructure (e.g., buildings, factories, roads, railways, bridges, electrical and communication networks, etc.) it is often desirable to model infrastructure using infrastructure modeling software. Some infrastructure modeling software architectures involve a number of client software applications (or simply "clients") operated by users interacting with remote (e.g., cloud-based) software that manages repositories that maintain shared infrastructure models. It is often desirable to allow multiple clients to operate concurrently upon the infrastructure models, to permit teams of users to work in parallel. Typically, a concurrency policy is required to allow clients to coordinate their work. One desirable concurrency policy is an optimistic concurrency policy. An optimistic concurrency policy may allow clients to modify the infrastructure model without obtaining locks and then later merge their changes with changes made by other clients, resolving any conflicts that are detected at merge time.

However, use of an optimistic concurrency policy and later conflict-detection and merging may introduce a number of problems in an infrastructure modeling software architecture. As explained in greater detail below, one specific problem involves creation of incomplete timelines (i.e. ordered sets of changesets used to represent the infrastructure model). An incomplete timeline may be created that does not show that certain conflicts have already been resolved, which may cause another client that is making a new change to detect an already resolved conflict, but in reverse. A situation may arise where clients compete and "fight against" each other to reconcile conflicts, rendering the infrastructure modeling software architecture largely non-functional.

Accordingly, there is a need for improved techniques to address problems in conflict-detection and merging in an infrastructure modeling software architecture.

SUMMARY

In example embodiments, techniques are provided to implement changeset conflict rebasing when performing conflict-detection and merging in an infrastructure modeling software architecture. Changeset conflict rebasing involves adjusting the pre-change values in a local changeset so they match post-change values of a remote version, rather an original base version, or removing changes from the local changeset entirely.

In one example embodiment, a client executing on a client device changes a property of an object of an infrastructure model to create a local version. In response to receiving a trigger to push the local version of the property to a repository that maintains a shared timeline for the infrastructure model, the client pulls a remote version of the property. The client detects a conflict between the remote version and the local version, and reconciles the conflict to create an updated local version. A local changeset is generated for the updated local version. The client then rebases the generated local changeset by adjusting a pre-change value in the local changeset to match a post-change value of the remote version or to remove the change from the local changeset. Finally, the rebased local changeset is pushed from the client to the repository.

It should be understood that a variety of additional features and alternative embodiments may be implemented other than those discussed in this Summary. This Summary is intended simply as a brief introduction to the reader, and does not indicate or imply that the examples mentioned herein cover all aspects of the disclosure, or are necessary or essential aspects of the disclosure.

BRIEF DESCRIPTION OF THE DRAWINGS

The description below refers to the accompanying drawings of example embodiments, of which:

FIG. 4 is a table showing different combinations of changes that can conflict and reconciliation decisions, and how these cases may be addressed by changeset conflict rebasing;

FIG. 5A is a portion of an element table maintained in a repository showing storage of a base version, according to a first example;

FIG. 5B is a portion of a shared timeline for the infrastructure model, showing state at the initial time;

FIG. 5C is a portion of a first client's local copy of an element table, showing the first client's change of the value of a property;

FIG. 5D is a portion of the first client's local timeline for the infrastructure model, showing the creation of a local changeset;

FIG. 5E is a portion of the second client's local copy of the element table, showing the second client's change of the value of the property;

FIG. 5F is a portion of the second client's local timeline for the infrastructure model, showing the creation of a local changeset;

FIG. 5G is a portion of the shared timeline for the infrastructure model, showing the first client's changeset becoming the new tip;

FIG. 5H is the changeset from the shared timeline for the infrastructure model that the second client pulls and merges prior to pushing its local version back;

FIG. 5I is a portion of the second client's local timeline, showing the second client reconciling the conflict by keeping its local change;

FIG. 5J is a portion of the shared timeline for the infrastructure model, showing the effect of the second client pushing its local changeset without rebasing;

FIG. 5K is a portion of the second client's local timeline for the infrastructure model, showing the effects of changeset conflict rebasing;

FIG. 5L is a portion of the shared timeline for the infrastructure model, showing the effect of the second client pushing its rebased local changeset;

FIG. 6A is a portion of the second client's local copy of the element table, showing the value of the property set to that of the pulled changeset, according to a second example;

FIG. 6B is a portion of the second client's local timeline for the infrastructure model, showing the result of merge operations with the acceptance of the pulled changeset;

FIG. 6C is a portion of the second client's local timeline for the infrastructure model, showing the effects of changeset conflict rebasing;

FIG. 7A is a portion of an element table maintained in a repository 140-144, showing storage of a base version of the infrastructure model, according to a third example;

FIG. 7B is a portion of a shared timeline for the infrastructure model, showing state at an initial time;

FIG. 7C is a portion of first client's local timeline for the infrastructure model, showing the creation of a local changeset;

FIG. 7D is a portion of the second client's local timeline for the infrastructure model, showing the creation of a local changeset;

FIG. 7E is a portion of the shared timeline for the infrastructure model, showing the first client's changeset becoming the new tip;

FIG. 7F is a portion of the second client's local timeline for the infrastructure model, showing the second client reconciling a conflict by keeping the local change; and FIG. 7G is a portion of the second client's local timeline for the infrastructure model, showing the effects of changeset conflict rebasing.

DETAILED DESCRIPTION

Definitions

Figure 1:
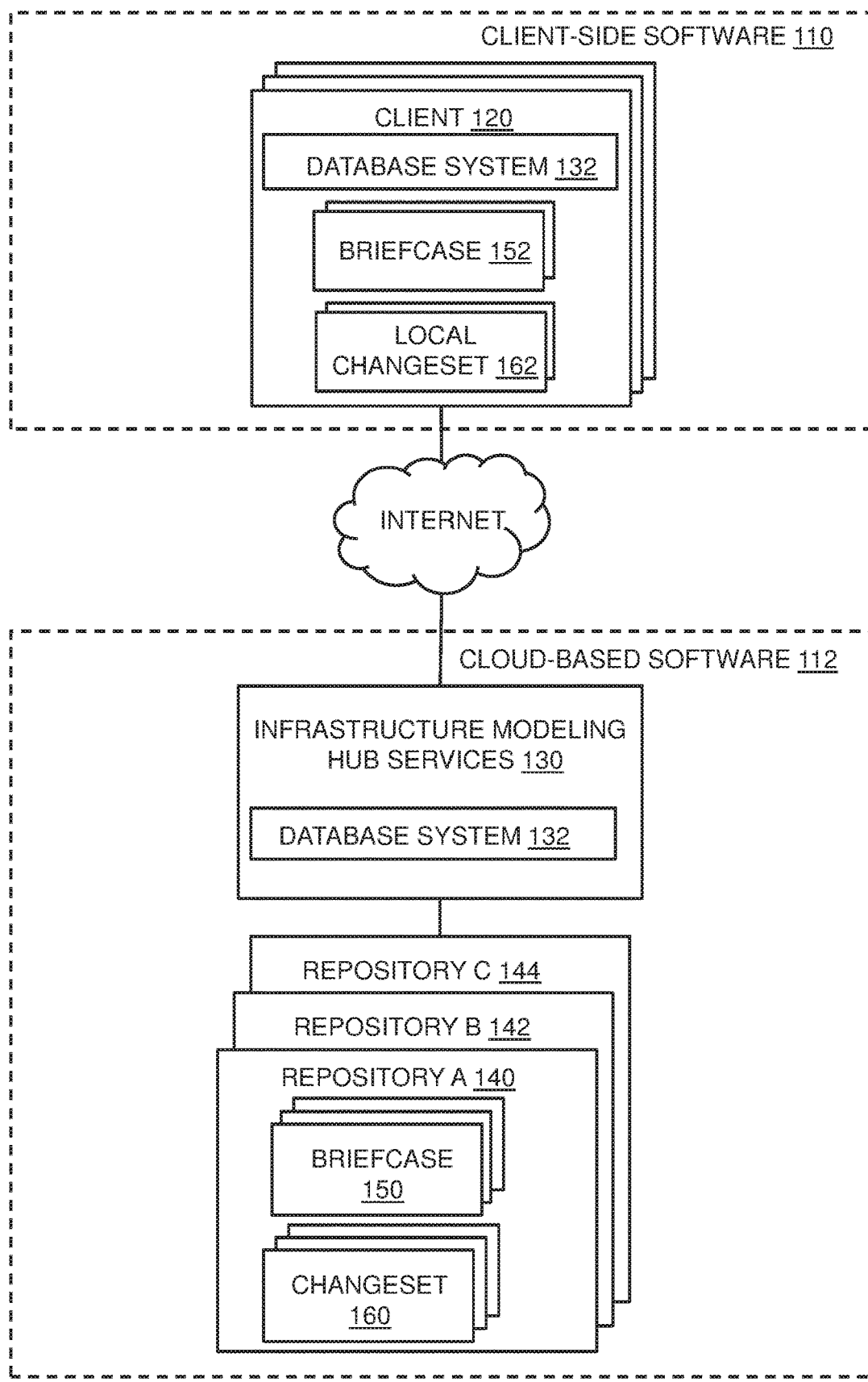
FIG. 1 is a high-level block diagram of at least a portion of an example infrastructure modeling software architecture.

As used herein, the term "infrastructure" refers to a physical structure or object that has been built, or is planned to be built, in the real-world. Examples of infrastructure include buildings, factories, roads, railways, bridges, electrical and communication networks, etc.

As used herein, the terms "built infrastructure schema" or "BIS" refer to a type of conceptual schema (i.e. a conceptual data model) that describes the semantics of data representing infrastructure.

As used herein, the term "infrastructure model" refers to a digital representation of infrastructure. An infrastructure model may be organized according to a built infrastructure schema. One specific type of infrastructure model may be the iModel® infrastructure model.

As used herein, the term "infrastructure modeling repository", or simply "repository", refers to a distributed database that stores one or more infrastructure models. Each constituent database of such a distributed database may be referred to as a "briefcase," as discussed below.

As used herein, the term "changeset" refers to a persistent electronic record that captures changes needed to transform a particular instance of a database from one version to a new version. As explained below, in example implementations, an ordered series of changesets may represent a timeline. Changesets of a timeline may capture the changes needed to move an instance of a database from one version (a version M) to another version (a version Q). The changesets may be applied in sequential order to move version M to version Q. The changesets may also be applied in reverse sequential order to move version Q back to version M.

As used herein, the term "briefcase" refers to a particular instance of a database. In example implementations, when a briefcase is used as a constituent database of a repository, the briefcase may represent a materialized view of the information of a specific version of the repository. A version of a briefcase (a version M) may be considered the information resulting from sequentially applying all changesets up to and including changeset M to a "baseline" briefcase, for example, an empty "baseline" briefcase. A briefcase of version M can be moved to another version (a version Q) by applying to it the set of changesets from N to Q, inclusive.

As used herein, the term "element" refers to a record maintained in a briefcase. An element represents (i.e. "models", in a colloquial sense of the term) an entity in the real-world. In example implementations, the entity in the real-world may be an individual unit of infrastructure.

As used herein, the term "model" refers to a container for a set of elements where the set of elements collectively represent (i.e. "model", in a colloquial sense of the term) an entity in the real-world. In example implementations, the entity in the real-world may be an individual unit of infrastructure. In some cases, models may nest. That is, a model is said to "break down" a particular element into a finer-grained description (i.e. a description that describes the same entity in the real-world but at a fine granularity).

As used herein, the term "relationship" refers to a connection that relates two or more elements or models. Examples of relationships include parent-child relationships that may imply ownership and peer-peer relationships that may define groups.

As used herein, the term "digital object" or simply "object" refers collectively to an element, model or relationship. An object may have be defined by a set of properties that have values.

Example Embodiments

FIG. 1 is a high-level block diagram of at least a portion of an example infrastructure modeling software architecture. The architecture may be divided into client-side software 110 executing on one more or more computing devices arranged locally (collectively "client devices"), and cloud-based services software 120 executing on one or more remote computing devices ("cloud computing devices") accessible over the Internet.

The client-side software 110 may include client software applications (or simply "clients") 120 operated by users. The clients 120 may be of various types, including desktop clients that operate directly under an operating system of a client device and web-based client applications that operate within a web browser. The clients 120 may be concerned mainly with providing user interfaces that allow users to create, modify, display and/or otherwise interact with infrastructure models (e.g. iModel® infrastructure models). The cloud-based software 112 may include infrastructure modeling hub services (e.g., iModelHub™ services) 130 that manage repositories 140-144 that maintain the infrastructure models. The clients 120 and the infrastructure modeling hub services 130 may utilize a built infrastructure schema (BIS)

that describes semantics of data representing infrastructure, using high-level data structures and concepts. As such, the clients 120 and the infrastructure modeling hub services 130 may be referred to as "BIS-based" software. The BIS-based software may utilize (be layered upon) an underlying database system (e.g., SQLite) 132 that handles primitive database operations, such as inserts, updates and deletes of rows of tables of underlying distributed databases (e.g., SQLite databases). The database system 132 may utilize an underlying database schema (e.g., a SQLite schema) that describes the actual rows and columns of the tables.

In more detail, the conceptual schema (e.g., BIS), may describe infrastructure using digital objects (or simply "objects") that include elements, models, and relationships, which serve as building blocks of an infrastructure model. Elements represent (i.e. "model", in a colloquial sense of the term) entities in the real-world. One element may be the "lead" element, based on the nature of the entity being modeled. Other elements typically relate back the lead element. A model acts as a container for a set of elements where the set of elements collectively represent (i.e. "model", in a colloquial sense of the term) an entity in the real-world. In some cases, models may nest. That is, a model is said to "break down" a particular element into a finer-grained description. Models may be arranged according to a model hierarchy to support modeling from multiple perspectives. A single repository model may serve as a root of the model hierarchy. Relationships relate two or more elements or models. Examples of relationships include parent-child relationships that may imply ownership and peer-peer relationships that may define groups.

Likewise, the underlying database schema (e.g., a SQLite schema) may describe how the objects are stored to individual rows of tables of the underlying databases. Objects may be maintained using multiple rows of multiple different tables, which store their properties. For example, properties of an element may be spread across multiple rows of multiple tables. To create, remove or modify an object, primitive database operations such as inserts, deletes or updates are performed by the underlying database system (e.g., SQLite) 132 upon the appropriate rows of the appropriate tables.

To enable multiple versions and concurrent operation, briefcases and changesets may be utilized by the clients 120 and infrastructure modeling hub services 130. A briefcase is a particular instance of a database, that when used as a constituent database of a repository 140-144, represents a materialized view of the information of a specific version of the repository. Initially an "empty" baseline briefcase may be programmatically created. Over time the baseline briefcase may be modified with changesets, which are persistent electronic records that capture changes needed to transform a particular instance from one version to a new version. A changeset often includes original values (pre-change) values of selected properties of objects as well as the new (changed) values of those selected properties.

Each changeset is made at a point in the lifetime of an infrastructure model. The lifetime of an infrastructure model may be represented as one or more timelines. There is typically a main timeline and branch timelines, where each branch timeline represents the development of an alternative version. Typically, each changeset records a unique identity of the immediately proceeding changeset, which is commonly referred to as its "parent changeset" or simply "parent." The most recent changeset in a timeline is commonly referred to as the "tip changeset" or simply the "tip". The "tip state" of an infrastructure model reflects application of changesets up to the tip. Adding a changeset to a timeline (thereby making it the tip) is commonly referred to as "pushing." While there may be multiple timelines (e.g., main and branch), for simplicity of description below, it is assumed that there is only one timeline. It should be understood that the techniques discussed below may be readily extended to use with multiple timelines.

As the number of changesets in a timeline grows, the time required to take a baseline briefcase and apply all changesets needed to transform it to a specific version may grow large. For this reason, additional briefcases storing different versions of the infrastructure model at different points along the timeline are often generated. Each additional briefcase may be considered a "snapshot" of the infrastructure model at a different point in time. To reach the tip state of an infrastructure model, the most recent briefcase may be accessed and changesets up to and including the tip applied.

Infrastructure modeling hub services 130 may maintain briefcases 150 and a set of accepted changesets 160 (i.e. changesets that have been successfully pushed) in a repository 140-144. When a client 120 desires to operate upon an infrastructure model, it may obtain the briefcase 150 from a repository 140-144 closest to the desired state (e.g., the tip state) and those accepted changesets 160 from the repository 140-144 that when applied bring that briefcase up to the desired state. To avoid the need to constantly access the repository 140-144, clients may maintain a copy of a local copy 152 (a local instance of the database).

When a client 120 desires to make changes to the infrastructure model, it may use the database system (e.g., SQLite) 132 to preform primitive database operations, such as inserts, updates and deletes, on rows of tables of its local copy. The client 120 records these primitive database operations and eventually bundles them to create a local changeset 162. At this stage, the local changeset 162 represents pending changes to the infrastructure model, that are reflected locally on the client 120, but that have not yet been accepted to be shared with other clients. Subsequently, the client 120 may push the local changeset 162 back to infrastructure model hub services 130 to be added to the set of accepted changesets 160 in a repository 140-144. In this manner, a shared timeline of the infrastructure model is extended.

Since the shared timeline is typically constructed by multiple clients 120 operating independently, there is the potential for changes to conflict. Two changes conflict when they cannot both be applied (in any order) without contradicting or reversing each other. Conflicting changes generally do not occur when multiple clients insert properties of the same object, but may occur when multiple clients change the same property of the same object to different values, or when one client deletes an object that another client has changed, or vice versa. Accordingly, a concurrency policy is required to allow clients to coordinate their work.

The clients 120 may implement an optimistic concurrency policy. As part of these operations, a client detects and merges conflicts between changes of a local changeset 162 with changes of accepted changeset 150 that were pushed by other clients in the interim the client was working on its changes.

Figure 2:
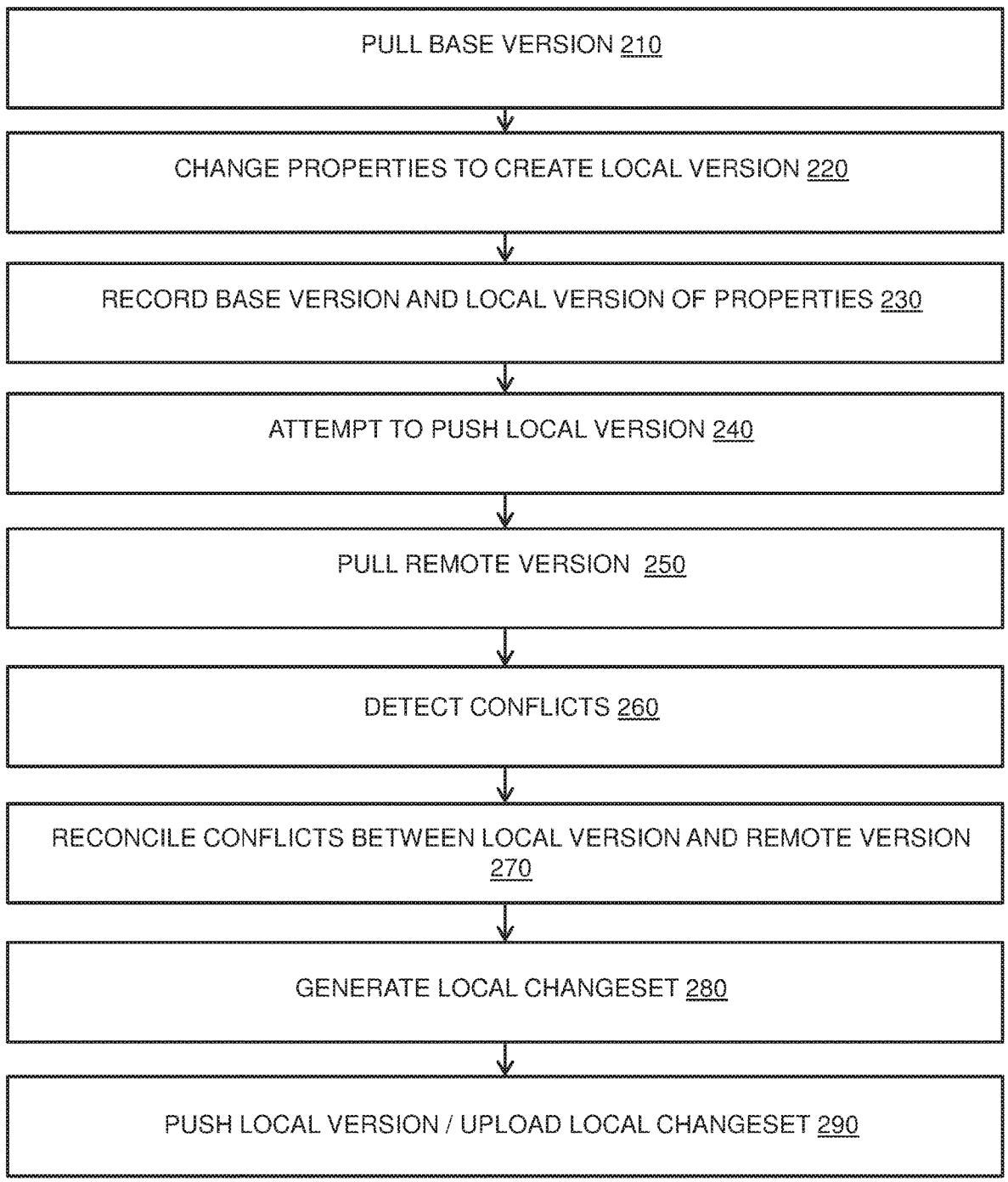
FIG. 2 is a flow diagram of example operations that may be implemented by clients of the infrastructure modeling software architecture to change properties of an object and detect and merge conflicts.

FIG. 2 is a flow diagram of example operations that may be implemented by clients 120 of the infrastructure modeling software architecture to change properties of an object and detect and merge conflicts. For purposes of discussion, three versions of an infrastructure model (and its objects and their properties) are considered. A "base version" is the version before the client has started work on its changes. A "local version" is the version resulting from the client's pending changes, as reflected by a local changeset. The "remote version" is the tip state which reflects application of changesets of other clients to the base version up to and including the most recent pushed changeset.

At step 210, a client 120 pulls a base version of an infrastructure model. As discussed above, the client may obtain a briefcase 150 and accepted changesets 160 that, when applied, bring the infrastructure model to the current tip. The base version reflects a state of the infrastructure model at an initial time (e.g., time=0) along a shared timeline.

At step 220, the client 120 changes at least one property of at least one object of the infrastructure model, creating a local version. For example, the base version of the infrastructure model may be displayed in a user interface of the client, and in response to user input in the user interface, changes may be made to it. The local version reflects a state of the infrastructure model at a second (e.g., time=2.1) along a local branch of the timeline.

As part of step 230, the client 120 records the base version of the properties as well as the local version. The client may utilize the underlying database system (e.g., SQLite) 132 to record this information as primitive operations are performed on the rows of the tables of the underlying databases. The database system may record a unique, stable identity of each property being changed, its pre-change value (e.g., the value from time=0), and its changed value (e.g., the value from time=2.1).

At step 240, the client 120 attempts to push the local version of the properties to a repository 140-144 to extend the shared timeline. The trigger to attempt to push may be user input in the user interface of the client 120, or another type of event. The attempt to push may be rejected by infrastructure model hub services 130, for example, because the shared timeline was extended in the interim by other clients. In such case, the local changes may need to be reconciled with the additional changesets before they can be added to the timeline.

At step 250, the client 120 pulls a remote version of the properties which reflect changes made by other clients in the interim the client 120 was working on the infrastructure model (e.g., between time=0 and time=2.1). The client 120 obtains the remote version by pulling changesets from the repository 140-144 up to the current tip. For example, a changeset may have been pushed by a second client (e.g., at time=1.1) that included different changes on the same properties that were locally changed. Such changeset may now be pulled to learn of these changes by the second client.

At step 260, the client 120 detects conflicts between the remote version of the properties and the local version of the properties. The client may compare the values of the pulled changesets with local values, and determine where the same properties have been assigned different values. For example, identities and values of a pulled changeset (e.g., from time=1.1) is compared to the changed value (e.g., at time=2.1) of the local version.

At step 270, the client 120 reconciles conflicts between the local version of the properties and the remote version. For example, conflicts between the pulled changeset (e.g., from time=1.1) are reconciled with the local change (e.g., at time=2.1). Conflicts may be reconciled by either rejecting the remote change in favor of retaining the local change (or generating a new local change) or accepting the remote change by reversing and replacing the local change. The decision whether to use the remote change or the local change may be based on user input. For example, the client may display indication of the conflicts in its user interface, and the user may select which change to utilize.

At step 280, a local changeset 162 is generated for the updated local version. The local changeset stores the original values (pre-change values) from the base version as well as the new values (changed values) of the updated local version.

At step 290, the local version is pushed. The client 120 uploads the local changeset 162 to a repository 140-144 where it is added to the accepted changesets 160, updating the timeline with a new tip. The newly accepted changeset will indicate the changed value (e.g., of time=2.1) replaced the value from the base version (e.g., of time=0). The new tip state of the infrastructure model (including the newly accepted changeset) may be accessed by other clients, with the new tip being pulled. The other clients may also utilize the new tip state of the infrastructure model to push their own changes, for display purposes, or for other tasks.

Unfortunately, here a problem may occur as the timeline resulting from the sequence of steps in FIG. 2 does not show that the conflicts with other clients (e.g., the second client) have been resolved (i.e. the timeline is incomplete). The pushed local version appears to be based on the base version, not on the remote version. That is, the pushed local changeset 162 (e.g., from time=2.1) appears to have been based on the original state of the infrastructure model (e.g., at time=0). There is no indication that the client was aware of and reconciled any changesets of other clients (e.g., a pulled changeset of a second client with changes at time=1.1). As a result, the timeline is incomplete.

The incomplete timeline may cause another client (e.g., the second client) that is making a new change to the infrastructure model to detect the already resolved conflict, but in reverse. A situation may arise where clients compete and "fight against" each other to reconcile conflicts, rendering the infrastructure modeling software largely non-functional.

To address this problem, changeset conflict rebasing may be introduced into the sequence of steps of FIG. 2. Changeset conflict rebasing involves adjusting the pre-change values in the local changeset 162 so they match post-change values of the remote version (the current tip), rather than the original base version, or removing changes from the local changeset entirely. Once all the conflicting changes in the local changeset have been rebased (the pre-change values adjusted or the changes removed entirely, as the case may be) then the local changeset may be pushed to become the new tip. Other clients that pull the rebased changeset from a repository 140-144 will not see any unresolved conflicts. The timeline they see is complete, with any pre-change values of properties matching the preceding state.

Figure 3:
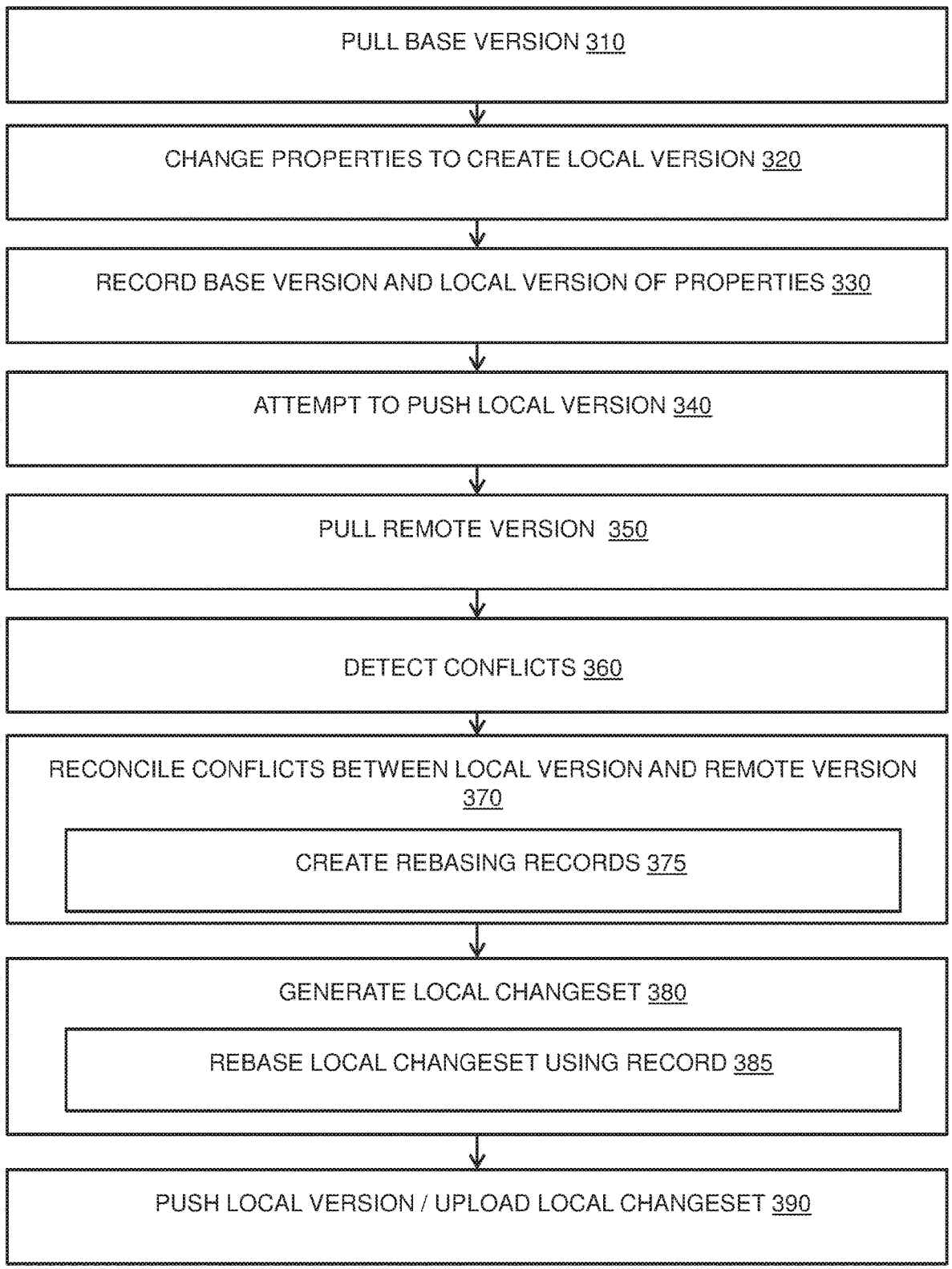
FIG. 3 is a flow diagram of example operations that may be implemented by clients of the infrastructure modeling software architecture to change properties of an object and detect and merge conflicts, with the addition of changeset conflict rebasing operations.

FIG. 3 is a flow diagram of example operations that may be implemented by clients 120 of the infrastructure modeling software architecture to change properties of an object and detect and merge conflicts, with the addition of changeset conflict rebasing operations. Steps 310-360 are identical to steps 210-260, respectively, of FIG. 2. However, step 370 is modified from step 270, where the client 120 reconciles conflicts between the local version of the properties and the remote version, that includes sub-step 365. In sub-step 375, the underlying database system (e.g., SQLite) 132 creates rebasing records that store information about post-change values of the remote version and/or whether the local change is to be removed entirely. Further, step 380 is modified from step 280, where the client 120 generates the local changeset 162, to include sub-step 385. In sub-step 385, the client uses the underlying database system (e.g., SQLite) 132 to access the previously stored rebasing records, and applies them to adjust pre-change values so they match post-change values of the remote version (the current tip) or to remove changes entirely. The sequence ends at step 390, which is again identical to step 290 of FIG. 2.

The changeset conflict rebasing operations in sub-steps 375 and 385 of FIG. 3 may cover various cases arising from different combinations of types of changes that can conflict, and ways those conflicts may be reconciled. FIG. 4 is a table showing different combinations of changes that can conflict, and reconciliation decisions, and how these cases may be addressed by changeset conflict rebasing. As shown in row 410, where the local change is an update and the remote change is an update, and the conflict is reconciled by rejecting the remote change in favor of retaining the local change, changeset conflict rebasing adjusts the pre-change value in the local version to match the post-change value of the remote version. In this case, the pre-change value is changed in the local changeset to be the post-change value in the pulled changeset. As shown in rows 420, 440 and 470, where the local change is an update and the remote change is an update, and the conflict is reconciled by accepting the remote change over the local change; or the local change is an update and the remote change is a delete, and the conflict is reconciled by accepting the remote change over the local change; or where the local change is a delete and the remote change is a delete, and the conflict is reconciled by accepting the remote change over the local change, changeset conflict rebasing removes the local change entirely. In these cases the local change is deleted entirely from the local changeset.

It should be noted that some cases may not be fully supported by changeset conflict rebasing. As shown in row 430 and 460, in cases were the local change is an update and the remote change is a delete, and the conflict is reconciled by rejecting the remote change in favor of retaining the local change; or where the local change is a delete and the remote change is an update, and the conflict is reconciled by accepting the remote change over the local change, changeset conflict rebasing may not support the operation. It may not be feasible to reject a remote delete that conflicts with a local update because the scope of the remote delete is often broader than the scope of the local update. For example, an object is often part of a related set of objects. A remote delete may remove them all, while the local update may affect only one object. Such case is preferably avoided by communication between the users of the clients. Likewise, it may not be feasible to accept a remote update to an object that was locally deleted. There is not enough information in the changeset to un-delete the object. Again, such case is preferably avoided by communication between the users of the clients.

The above described techniques for changeset conflict rebasing may be better understood by considering a number of specific examples. In a first example, suppose an infrastructure model includes an object, specifically an element, that is uniquely identified, specifically by ElementID=1, having a property with a value, specifically PropertyA=0, at an initial time, specifically time=0 FIG. 5A is a portion of an element table maintained in a repository 140-144 showing storage of a base version, according to a first example. The element table is maintained by the underlying database system (e.g., SQLite). It should be understood that, while in this first example there is a simple mapping between the BIS-level element and a single row of an underlying table, mappings may be much more complex.

FIG. 5B is a portion of a shared timeline for the infrastructure model, showing state at the initial time (time=0). The bracketed expression in FIG. 5B represents a changeset. The base version in this example was produced in the first place by inserting the element with ElementID=1 and PropertyA=0.

Suppose two clients (a first client referred to as "Client1" and a second client referred to as "Client2") pull the base version of the infrastructure model, obtaining in part the changeset shown in FIG. 5B. Each client may store its own local copy, for example, using a local briefcase.

Suppose, at a first time (time=1.1), the first client changes PropertyA of ElementID=1 from 0 to 1 creating a local version of the infrastructure model at the first client. Such change may be in response to user input in the user interface of the first client, as discussed above.

FIG. 5C is a portion of the first client's local copy of the element table, showing the first client's change of the value of the property. FIG. 5D is a portion of the first client's local timeline for the infrastructure model, showing the creation of a local changeset. As can be seen, the changeset at time=1.1 of the local timeline of the first client includes an update on ElementID=1 showing the old value of 0 and the new value of 1 for PropertyA.

Suppose, at a second time (time=2.1) the second client changes PropertyA of ElementID=1 from 0 to 2, creating a local version of the infrastructure model at the second client. Such change may be in response to user input in the user interface of the second client. FIG. 5E is a portion of the second client's local copy of the element table, showing the second client's change of the value of the property. FIG. 5F is a portion of the second client's local timeline for the infrastructure model, showing the creation of a local changeset. As can be seen, the changeset at time=2.1 of the local timeline of the second client includes an update on ElementID=1 showing the old value of 0 and the new value of 2 for PropertyA.

Suppose that the first client is triggered to push the local version of the property back to a repository 140-144, to update the shared timeline. Upon acceptance of the changeset, the shared timeline is updated. FIG. 5G is a portion of the shared timeline for the infrastructure model, showing the first client's changeset becoming the new tip. A changeset has been added at time=1 in the shared timeline.

Suppose that the second client is triggered to push its local version of the property back to a repository 140-144, to update the shared timeline. The second client began with the infrastructure model with a changeset at time=0, but now the tip is at time=1. So the second client's copy is out of date. The second client should pull and merge the changeset at time=1.

FIG. 5H is the changeset from the shared timeline for the infrastructure model that the second client pulls and merges prior to pushing its local version back. When attempting to apply the changeset, the database system (e.g., SQLite) at the second client detects a conflict. The second client's change of PropertyA was based on PropertyA=0, while the first client had changed PropertyA=1. This indicates that the second client did not know about the changeset at time=1 when the second client made the local change. Suppose the second client reconciles the conflict by keeping the local change of PropertyA=2, rejecting the change by the first client, for example, in response to input in its user interface.

FIG. 5I is a portion of the second client's local timeline, showing the second client reconciling the conflict by keeping its local change. As can be seen, the changeset at time=2.1 has an old property value that does not coincide with the new property value of its parent at time=1 (i.e.

Old:PropertyA=0 does not coincide with New:PropertyA=1). Absent rebasing, a problem would occur.

FIG. 5J is a portion of the shared timeline for the infrastructure model, showing the effect of the second client pushing its local changeset without rebasing. If another client (e.g., the first client) were to pull the changeset at time=2C it would detect the same conflict that the second client had resolved, but in reverse (since the old property value does not coincide with the new property value of its parent). The problem is resolved with changeset conflict rebasing.

With changeset conflict rebasing, the second client changes the changeset at time=2.1 before pushing, so it is based on the changeset at time=1. FIG. 5K is a portion of the second client's local timeline for the infrastructure model, showing the effects of changeset conflict rebasing. As can be seen, the changeset at time=2.1 has been altered so that the old property value (i.e. Old:PropertyA=1) coincides with the new property value of its parent at time=1 (i.e. New:PropertyA=1)

FIG. 5L is a portion of the shared timeline for the infrastructure model, showing the effect of the second client pushing its rebased local changeset. If another client (e.g., the first client) were to pull the changeset at time=2 it would detect no conflicts, as the changeset at time=2 is based on the changeset at time=1, with the old and new property values coinciding.

In a second example, suppose the situation is the same as in the first example discussed above, but to reconcile the conflict, instead of the second client keeping the local change and rejecting the change by the first client, the second client accepts the change by the first client of PropertyA=1 over its local change of PropertyA=2. FIG. 6A is a portion of the second client's local copy of the element table, showing the value of the property set to that of the pulled changeset, according to the second example. FIG. 6B is a portion of the second client's local timeline for the infrastructure model, showing the result of merge operations with the acceptance of the pulled changeset. As can be seen, the changeset at time=2.1 of the local timeline of the second client includes an update on ElementID=1 showing the old value of 0 (i.e. Old:PropertyA=0) and the new value of 2 for PropertyA (New:PropertyA=2), which is followed and overridden by a changeset at time=1 with an update on ElementID=1 showing an old value of 0 (Old:PropertyA=0) and the new value of 2 for PropertyA (New:PropertyA=2). Immediately after the merge, the changeset at time=1 does not appear to be based on the changeset at time=2.1 in the second client's local timeline, because the old value (Old:PropertyA=0) does not match the new value (New:PropertyA=2) of the prior changeset. If the changeset at time=2.1 were pushed by the second client to the shared timeline, and another client (e.g., the first client) were to pull the changeset, it would detect the same conflict that the second client had resolved, but in reverse.

The problem is addressed with changeset conflict rebasing. In this case, the second client removes the changeset at time=2.1 before pushing. FIG. 6C is a portion of the second client's local timeline for the infrastructure model, showing the effects of changeset conflict rebasing. As can be seen, the changeset at time=2.1 has been removed entirely. Thereby, if the shared timeline is updated based on information from the second client, another client would detect no conflicts, as there are no discrepancies between old and new property values.

In a third example, suppose a base version of an infrastructure model includes ElementID=1, having PropertyA=0 at time=0. FIG. 7A is a portion of an element table maintained in a repository 140-144, showing storage of a base version of the infrastructure model, according to the third example. FIG. 7B is a portion of a shared timeline for the infrastructure model, showing state at an initial time (time=0).

Suppose, at a first time (time=1.1) the first client changes PropertyA of ElementID=1 from 0 to 1, creating a local version of the infrastructure model at the first client. Such change may be in response to user input in the user interface of the first client, as discussed above.

FIG. 7C is a portion of first client's local timeline for the infrastructure model, showing the creation of a local changeset. As can be seen, the changeset at time=1.1 of the local timeline of the first client includes an update on ElementID=1 showing the old value of 0 and the new value of 1 for PropertyA.

Suppose, at a second time (time=2.1) the second client deletes the element with ElementID=1 creating a local version of the infrastructure model at the second client. Such change may be in response to user input in the user interface of the second client. FIG. 7D is a portion of the second client's local timeline for the infrastructure model, showing the creation of a local changeset. As can be seen, the changeset at time=2.1 of the local timeline at the second client includes a delete on ElementID=1. The database system (e.g., SQLite) maintains the old value of 0 of PropertyA before the element was deleted.

Suppose that first client is triggered to push the local version back to a repository 140-144, to update the shared timeline. Upon acceptance of the changeset from the first client, the shared timeline is updated. FIG. 7E is a portion of the shared timeline for the infrastructure model, showing the first client's changeset becoming the new tip. The changeset has been added at time=1 in the shared timeline.

Suppose that the second client is triggered to push its local version back to a repository 140-144, to update the shared timeline. The second client began with the infrastructure model with a changeset at time=0, but now the tip is at time=1. So the second client's copy is out of date. The second client should pull and merge the changeset at time=1.

When the second client pulls the changeset, the database system (e.g., SQLite) of the second client detects a conflict, since ElementID=1 does not exist in the second client's local version. Suppose the second client reconciles the conflict by keeping the local change of a delete and rejecting the change by the first client. FIG. 7F is a portion of the second client's local timeline for the infrastructure model, showing the second client reconciling the conflict by keeping the local change. As can be seen, the changeset at time=2.1 has an old property value that does not coincide with the new property value of its parent at time=1 (i.e. Old:PropertyA=0 does not coincide with New:PropertyA=1). Absent rebasing, a problem would occur.

With changeset conflict rebasing, the second client changes the changeset at time=2.1 before pushing so it is based on the changeset at time=1. FIG. 7G is a portion of the second client's local timeline for the infrastructure model, showing the effects of changeset conflict rebasing. As can be seen, the changeset at time=2.1 has been altered so that the old property value (i.e. Old:PropertyA=1) coincides with the new property value of its parent at time=1 (i.e. New:PropertyA=1). Now the timeline is complete and other clients would not detect an unresolved conflict.

In summary, changeset conflict rebasing may be employed to adjust pre-change values in a local changeset so they match post-change values of a remote version (the current tip), rather than the original base version, or remove changes from the local changeset entirely, so that, once pushed, other clients that pull the rebased changeset will not see any unresolved conflicts. Such technique may enable use of an optimistic concurrency policy in an infrastructure modeling software architecture that uses a underlying database system (e.g., SQLite) to manage primitive operations.

It should be understood that a wide variety of adaptations and modifications may be made to the techniques. Further, in general, functionality may be implemented in software, hardware or various combinations thereof. Software implementations may include electronic device-executable instructions (e.g., computer-executable instructions) stored in a non-transitory electronic device-readable medium (e.g., a non-transitory computer-readable medium), such as a volatile memory, a persistent storage device, or other tangible medium. Hardware implementations may include logic circuits, application specific integrated circuits, and/or other types of hardware components. Further, combined software/hardware implementations may include both electronic device-executable instructions stored in a non-transitory electronic device-readable medium, as well as one or more hardware components. Above all, it should be understood that the above description is meant to be taken only by way of example.

What is claimed is:

1. A method of changing a property of an object, and detecting and merging conflicts in an infrastructure modeling software architecture, comprising:
changing, by a client executing on a client device, a property of an object of an infrastructure model to create a local version including a change;
pulling a remote version of the property from a repository;
detecting a conflict between the remote version and the local version;
reconciling the conflict to create an updated local version;
generating, at a given point in time, a local changeset for the updated local version, the local changeset including a pre-change value and a post-change value, the pre-change value in the local changeset representing an original value of the property of the object at the client before the change, and the post-change value in the local changeset representing a new value of the property of the object at the client; and
rebasing the generated local changeset by adjusting the pre-change value in the local changeset to match a post-change value of the remote version while maintaining unchanged the post-change value in the local changeset, to thereby produce a rebased local changeset.

2. The method of claim 1, wherein the reconciling further comprises:
generating, by an underlying database system, rebasing records that store information about the post-change value of the remote version.

3. The method of claim 2, wherein the rebasing further comprises:
accessing, using the underlying database system, the rebasing records and applying the rebasing records to adjust the pre-change value in the local changeset to match the post-change value of the remote version.

4. The method of claim 1, wherein the change in the local version is an update and the remote version includes a change of an update, and the reconciling the conflict comprises rejecting the remote version in favor of retaining the local version.

5. The method of claim 2, wherein the client utilizes a built infrastructure schema (BIS) and the underlying database system is a SQLite database system.

6. The method of claim 1, further comprising:
receiving a trigger to push the local version of the property to a repository that maintains a shared timeline for the infrastructure model;
pushing the rebased local changeset from the client to the repository such that the rebased local changeset becomes a newly accepted changeset of the repository;
pulling the newly accepted changeset by another client; and
utilizing the newly accepted changeset by the another client to display an updated view of the infrastructure model in a user interface of the another client.

7. A non-transitory electronic device readable medium having instructions that when executed on one or more processors of one or more electronic devices are operable to:
change a property of an object of an infrastructure model to create a local version including a change;
pull a remote version of the property from a repository;
detect a conflict between the remote version and the local version;
reconcile the conflict to create an updated local version;
generate, at a given point in time, a local changeset for the updated local version, the local changeset including a pre-change value and a post-change value, the pre-change value in the local changeset representing an original value of the property of the object before the change to the property of the object, and the post-change value in the local changeset representing a new value of the property of the object; and
rebase the generated local changeset by adjusting the pre-change value in the local changeset to match a post-change value of the remote version while maintaining unchanged the post-changed value in the local changeset, to thereby produce a rebased local changeset.

8. The non-transitory electronic device readable medium of claim 7, further comprising instructions that when executed are operable to:
generate rebasing records that store information about the post-change value of the remote version.

9. The non-transitory electronic device readable medium of claim 8, further comprising instructions that when executed are operable to:
access the rebasing records and apply the rebasing records to adjust the pre-change value in the local changeset to match the post-change value of the remote version.

10. The non-transitory electronic device readable medium of claim 7, wherein the change in the local version is an update and the remote version includes a change of an update, and reconciliation of the conflict comprises rejection of the remote version in favor of retention of the local version.

11. The non-transitory electronic device readable medium of claim 7, wherein the instructions are executed by a client that utilizes a built infrastructure schema (BIS) with an underlying SQLite database system.

12. A computing device comprising:
a processor; and
a memory coupled to the processor and configured to store a client that is executable on the processor having a user interface for interacting with infrastructure models, the client when executed operable to:
pull a base version of an infrastructure model from a cloud-based repository, in response to user input received in the user interface, change a property of an object of the infrastructure model to create a local version including a change, pull a remote version of the property from the repository, detect a conflict between the remote version and the local version, reconcile the conflict between the local version and the remote version to create an updated local version, generate, at a given point in time, a local changeset for the updated local version, the local changeset including a pre-change value and a post-change value, the pre-change value in the local changeset representing an original value of the property of the object before the change to the property of the object, and the post-change value in the local changeset representing a new value of the property of the object, and rebase the generated local changeset by adjusting the pre-change value in the local changeset to match a post-change value of the remote version while maintaining unchanged the post-changed value in the local changeset, to thereby produce a rebased local changeset.

13. The computing device of claim 12, wherein the client utilizes an underlying database system operable to generate rebasing records that store information about the post-change value of the remote version.

14. The computing device of claim 13, wherein the client when executed is further operable to access the rebasing records and apply the rebasing records to adjust the pre-change value in the local changeset to match the post-change value of the remote version.

15. A method of changing a property of an object, and detecting and merging conflicts in an infrastructure modeling software architecture, comprising:

updating, by a client executing on a client device, a property of an object of an infrastructure model to create a local version including a change;

detecting a conflict between a remote version of the property and the local version;

reconciling the conflict between the local version of the property and the remote version by rejecting the remote version in favor of retaining the local version;

generating a local changeset for the local version that includes a pre-change value of the property of the object and a post-change value of the property of the object, the pre-change value in the local changeset representing an original value of the property of the object at the client before the updating the property of the object, and the post-change value in the local changeset representing a new value of the property of the object at the client; and rebasing the generated local changeset by adjusting the pre-change value of the property of the object in the local changeset to match a post-change value of the remote version while maintaining unchanged the post-changed value in the local changeset, to thereby produce a rebased local changeset.

* * * * *